United States Patent
Uneme

[11] Patent Number: 6,084,480
[45] Date of Patent: Jul. 4, 2000

[54] PHASE LOCKED LOOP CIRCUIT INCLUDING VOLTAGE CONTROLLED OSCILLATOR AND LOW PASS FILTER

[75] Inventor: Masakatsu Uneme, Tokyo, Japan

[73] Assignee: NEC Corporation, Tokyo, Japan

[21] Appl. No.: 09/124,761

[22] Filed: Jul. 29, 1998

[30] Foreign Application Priority Data

Aug. 7, 1997 [JP] Japan .................................. 9-213216

[51] Int. Cl.⁷ ...................................................... H03L 7/10
[52] U.S. Cl. ................... 331/17; 331/16; 331/1 A; 331/36 C
[58] Field of Search ............................... 331/17, 1 A, 34, 331/16, 36 C

[56] References Cited

U.S. PATENT DOCUMENTS

| | | | |
|---|---|---|---|
| 5,021,749 | 6/1991 | Kasai et al. ................................ | 331/17 |
| 5,335,365 | 8/1994 | Ballantyne ............................. | 331/17 X |
| 5,355,098 | 10/1994 | Iwasaki ................................... | 331/1 A |

FOREIGN PATENT DOCUMENTS

| | | |
|---|---|---|
| 0 482 823 A2 | 4/1992 | European Pat. Off. . |
| 57 076931 | 5/1982 | Japan . |
| 61-106064 | 5/1986 | Japan . |
| 62-181525 | 8/1987 | Japan . |
| 6-61852 | 3/1994 | Japan . |

OTHER PUBLICATIONS

European Search Report dated Nov. 20, 1998.

*Primary Examiner*—Arnold Kinkead
*Attorney, Agent, or Firm*—McGinn & Gibb, P.C.

[57] ABSTRACT

A PLL circuit of which pull-in time is reduced. The PLL circuit comprises a voltage controlled oscillator; a frequency divider which divides the frequency of the output signal from the voltage controlled oscillator; a phase detector which compares the phase of a standard signal and the frequency-divided signal and outputs an advanced phase signal and a delayed phase signal; a charge pump which charges and discharges a capacitor in a low pass filter, depending upon the advanced/delayed phase signals; a voltage supplier which supplies the control terminal of the voltage controlled oscillator with a voltage which corresponds to the desired voltage decided by the different output frequencies of the voltage controlled oscillator, when the output of the low pass filter is not virtually connected with the control terminal of the voltage controlled oscillator.

13 Claims, 6 Drawing Sheets

F I G. 3
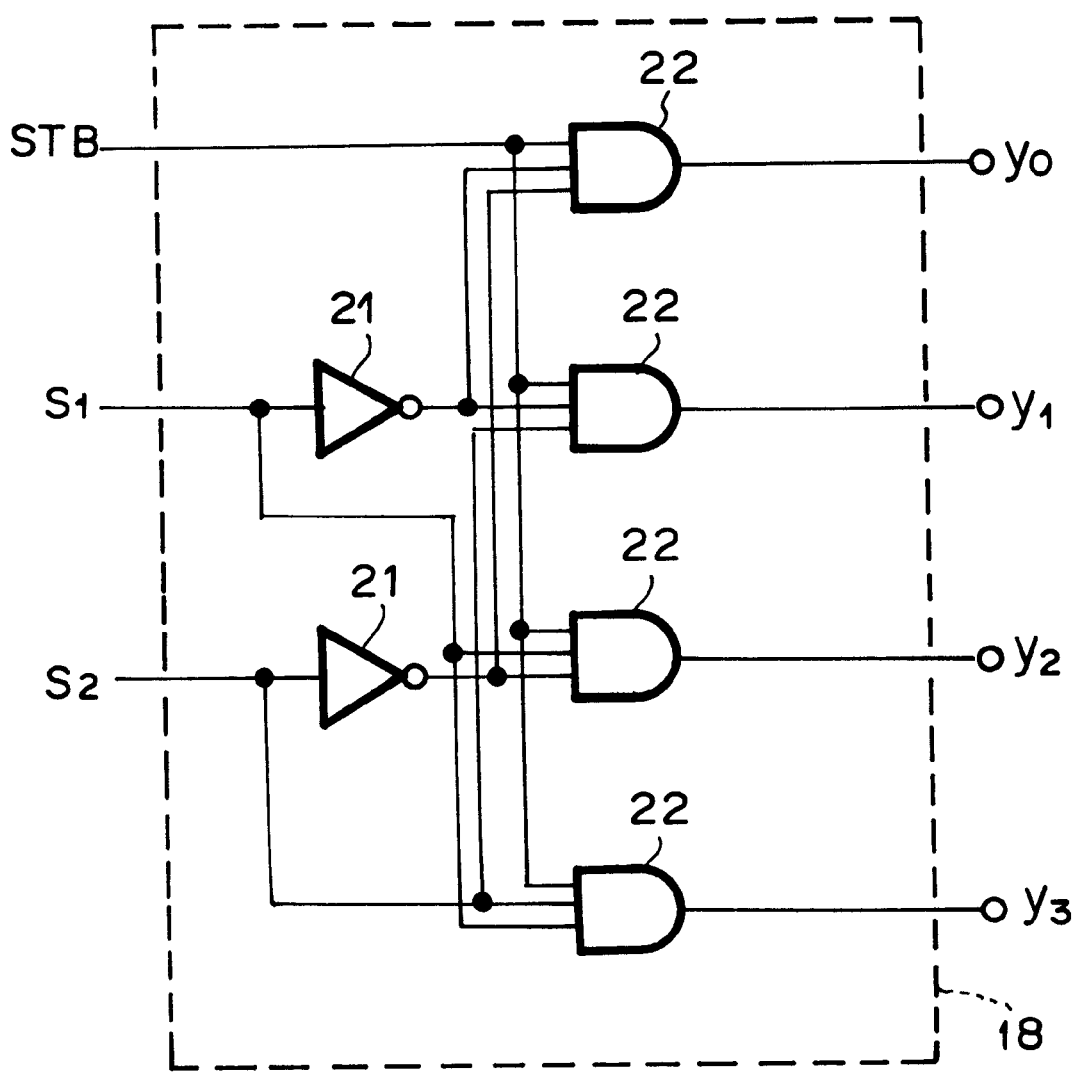

PHASE LOCKED LOOP CIRCUIT INCLUDING VOLTAGE CONTROLLED OSCILLATOR AND LOW PASS FILTER

BACKGROUND OF THE INVENTION

1. Field of the Invention

The present invention relates to a phase locked loop (PLL) circuit.

2. Description of the Prior Art

The fundamental operation of a conventional PLL circuit is explained.

In FIG. 5, an example of the fundamental PLL circuit is shown. Phase detector (PD) 1 accepts an external input signal frequency fi and a feedback signal frequency $f_0/N$ which is generated by multiplying the output signal frequency $f_0$ from voltage controlled oscillator (VCO) 4 by $1/N$ in frequency divider 5. PD 1 compares the frequencies and phases of fi and $f_0/N$ and then, outputs pulse signals PU and PD corresponding to the differences between them. Then, the outputs from PD 1 are fed into charge pump 2. Charge pump 2 converts the pulse signals PU and PD into analog quantities and outputs them to low pass filter (LPF) 3. LPF 3 eliminates the high frequency component and noise in the output signal from charge pump 2 and output it as $V_0$ to VCO 4. VCO 4 outputs the output signal frequency $f_0$ The output signal frequency $f_0$ multiplied by $1/N$ in frequency divider 5 is fed back into PD 1.

As explained above, the PLL circuit repeats these operations and stabilizes the frequency output of the input signal frequency fi multiplied by N, when the input signal fi becomes equal to the feedback signal frequency $f_0/N$. However, it is desirable to shorten the time (pull-in time) required to lock the PLL circuit until fi becomes equal to $f_0/N$, because the PLL circuit is a kind of frequency negative feedback circuit which acts to detect the differences of the phases between the input signal and the feed-back signal. Therefore, there is disclosed, for example, in the Japanese Patent laid-open No. Hei 8-228148 (1996), a technique wherein the time (lock-in time) required to lock the PLL circuit can be reduced, when the input signal frequency is changed.

In FIG. 6, a block diagram of the PLL circuit disclosed in the JP 8-228148 is shown. Here, only the differences from the conventional circuit shown in FIG. 5 are explained. When the strobe signal STB as well as the set-up frequency data DA is inputted into PLL processing unit 7, the set-up frequency data DA is written in PLL processing unit 7 on the basis of the clock signal CK. Then, PLL processing unit 7 divides the set-up frequency data DA on the basis of the standard frequency of quartz oscillator 6 and outputs the set-up signal fr into PD 1. The strobe signal STB is also fed to analog switch 108 which is connected in parallel with LPF 3. Analog switch 108 is closed only when the strobe signal STB is active. Accordingly, only when the set-up signal fr from PLL processing unit 7 is changed by the change of the set-up frequency data DA, the output SG1 from charge pump 2 is inputted into VCO 4 without passing through LPF 3. Thus, he lock-up time required to transit the frequency from the original frequency to the newly set-up frequency can be shortened. On the other hand, when set-up frequency data DA is not changed, the signal purity (frequency stability) is maintained, because analog switch 108 is not closed and output SG 1 from charge pump 2 passes through LPF 3.

The PLL circuit compares the phase difference between the input signal and the feedback signal, then, eliminates, by using the LPF, the high frequency component and noise of the signal voltage corresponding to the phase difference, and finally outputs from the VCO 4 the frequency on the basis of the output of the LPF. Then, the frequency output is frequency-divided and fed-back until the input signal frequency becomes equal to the feedback signal frequency. Therefore, the conventional PLL circuit has a problem that the pull-in time is required until the input signal frequency becomes identical to the feedback signal frequency. The pull-in in time depends upon the initial frequency, the phase difference between the input signal and the feedback signal, loop gain, and the time constant of the LPF. If the time constant of the LPF is reduced, the noise is not eliminated adequately and signal purity (frequency stability) is degraded, although the pull-in time is reduced. On the other hand, the conventional PLL circuit as shown in FIG. 6 can reduce the lock-up time in case of the change of the set-up frequency without degrading the signal purity (frequency stability), because the feed back signal by-passes the LPF, if the set-up frequency is changed. However, this by-pass technology is not effective for the reduction of the pull-in time.

SUMMMARY OF THE INVENTION

Therefore, an object of the present invention is to provide a PLL circuit with a reduced pull-in time.

In accordance with the present invention, there is provided a PLL circuit with the reduced pull-in time, which comprises a voltage controlled oscillator; a frequency divider which divides the frequency of the output signal from the voltage controlled oscillator; a phase detector which compares the phase of a standard signal and the frequency-divided signal and outputs an advanced phase signal and a delayed phase signal; a low pass filter for eliminating the high frequency component and noise of the signal; a charge pump which charges and discharges the capacitor in the low pass filter, depending upon the advanced/delayed phase signal; and a voltage supplier which supplies the control terminal of the voltage controlled oscillator with a voltage which corresponds to the desired voltage decided by the output frequency of the voltage controlled oscillator, when the output of the low pass filter is not virtually connected with the control terminal of the voltage controlled oscillator.

Instead of the above-mentioned single voltage supplier, a plurality of voltage suppliers may well be provided. They supply the control terminal of the voltage controlled oscillator with the voltages which correspond to desired voltages decided by the different output frequencies of the voltage controlled oscillator, when the output of the low pass filter is not virtually connected with the control terminal of the voltage controlled oscillator; and a switch which connects or does not connects at all virtually the control terminal of the voltage controlled oscillator with any one of the voltage suppliers.

The voltage supplier may comprise a first capacitor which is connected between a external voltage source and the control terminal of the voltage controlled oscillator and a second capacitor which is connected between the control terminal and the ground.

Here, the capacitance Ca of the first capacitor and the capacitance Cb of the second capacitor preferably hold the relation such as $Ca: Cb = V_0 : (Vdd - V_0)$, where Vdd is the voltage of the external voltage source and $V_0$ is the desired voltage corresponding to the output frequency of the voltage controlled oscillator.

The above-mentioned switch may comprise an input means for accepting a stand-by signal and a signal which prescribes a frequency dividing ratio in the divider, an output means for outputting a selection signal which selects one of the voltage suppliers, when the stand-by signal is active, a de-multiplexing means for outputting the by-pass signal, when the stand-by signal is active, a connection means for connecting the control terminal of the voltage controlled oscillator with one of the voltage suppliers, when the selection signal is active and a short-circuit means for short-circuiting the low pass filter and the control terminal.

In the PLL circuit of the present invention, the impedance of each of the above-mentioned voltage suppliers is smaller than that of the low pass filter (LPF).

As explained above, the PLL circuit of the present invention comprises the additional capacitors with an analog switch for controlling the output voltage from LPF, the demultiplexer (DEMUX) for selecting a pair of the capacitors corresponding to the dividing ratio. By disposing the capacitors and the-DEMUX in between the LPF and the VCO, the initial deviations in frequency and phase of the input signal and feedback signal are repressed, when the set-up frequency has been inputted or changed, or when the dividing ratio has been changed, whereby the pull-in time is reduced.

BRIEF EXPLANATION OF THE DRAWINGS

FIG. 3 is a circuit diagram of a demultiplexer.

DESCRIPTION OF THE PREFERRED EMBODIMENT

Embodiment 1

Figure 1:
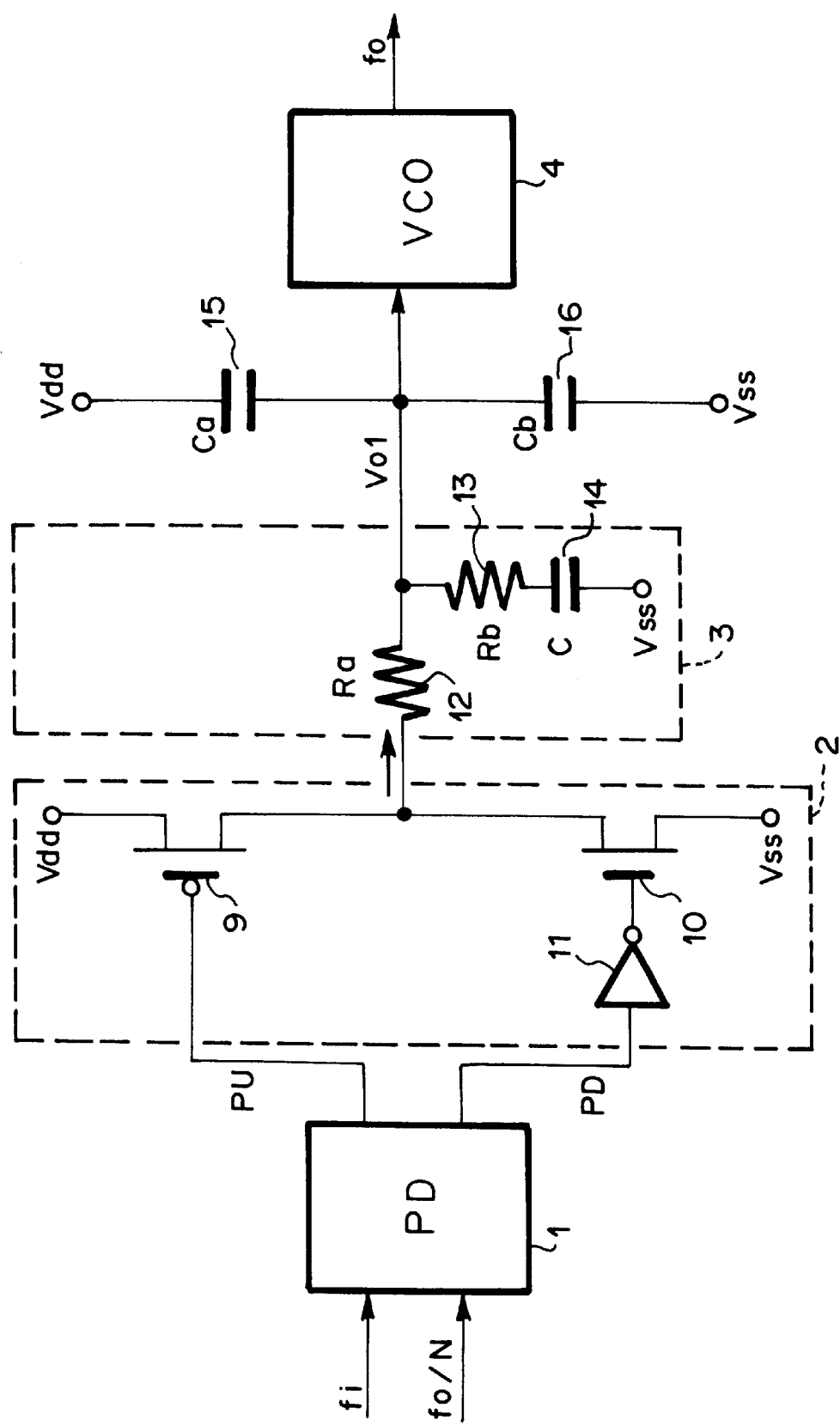
FIG. 1 is a circuit diagram of the PLL circuit of the first mode of the present invention.

Referring to the drawings, the embodiment 1 of the present invention is explained in detail.

Figure 5:
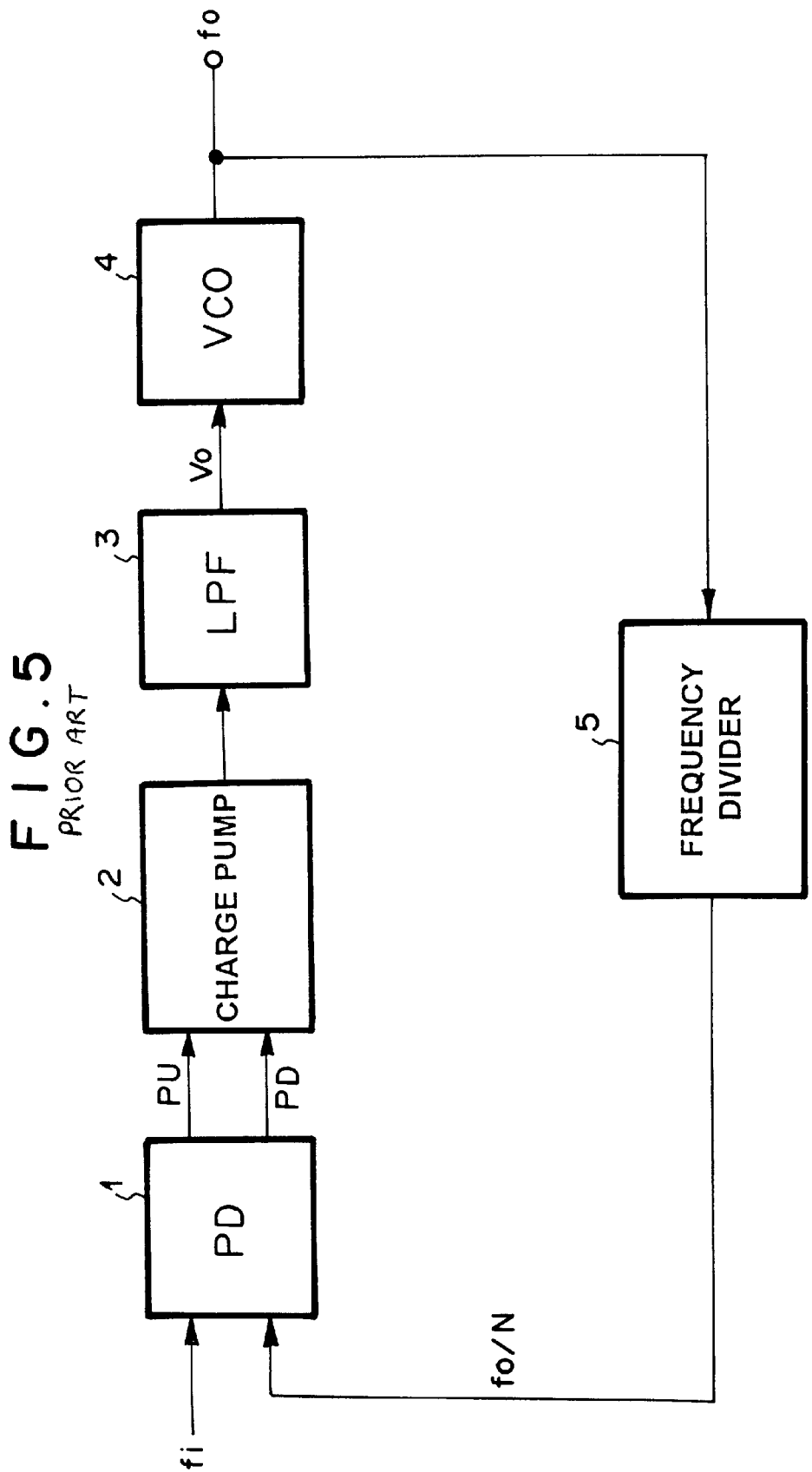
FIG. 5 is a fundamental circuit diagram of a conventional PLL circuit.
Figure 6:
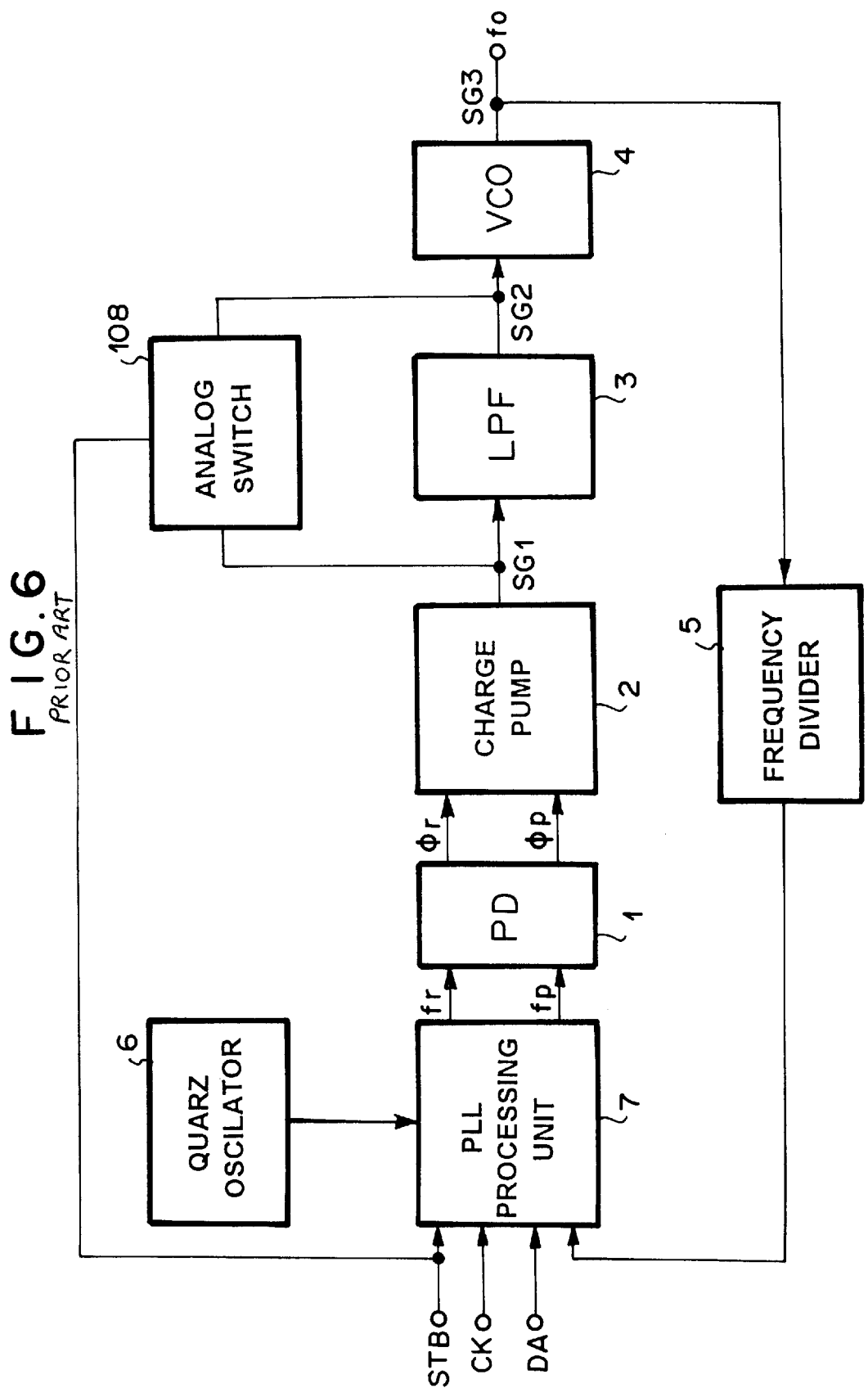
FIG. 6 is a circuit diagram of the conventional PLL circuit as disclosed in JP laid-open No. Hei 8-228148 (1996).

A circuit diagram of the first mode of the present invention is shown in FIG. 1. The reference numerals set forth in FIG. 1 apply to the same elements in FIG. 5. Charge pump 2 comprises P channel transistor 9, N channel transister 10 and NOT circuit 11. LPF 3 comprises register Ra 12, register Rb 13 and capacitor C 14. Further, at the output terminal of LPF 3, capacitor Ca 15 is connected with the voltage Vdd and capacitor Cb 16 is connected with the voltage Vss.

PD 1 compares the frequencies and phases of the inputted signal fi and the feedback signal $f_0/N$. If the frequency of the feedback signal $f_0/N$ is lower than that of the inputted signal fi or if the phase of $f_0/N$ is retarded, then, PD 1 outputs a low level pulse signal PU. On the other hand, if the frequency of the feedback signal $f_0/N$ is greater than that of the inputted signal fi or if the phase of $f_0/N$ is advanced, then, PD 1 outputs a low level pulse signal PD. The current flows toward the right, when pulse signal PU is low. Accordingly, charge pump 2 charges capacitor 14 in LPF 3 to increase the output voltage Vo1 of LPF 3. On the other hand, current I flows toward the left, when pulse signal PD is low. Accordingly, charge pump 2 discharges capacitor 14 in LPF 3 to decrease the output voltage Vo1 of LPF 3. If pulse signals PU and PD are high, current I becomes zero and the Vo1 is unchanged.

Then, output voltage Vo1 which is the input voltage to VCO 4 approaches the value expressed in terms of the reciprocals of the capacitances of Ca 15 and Cb 16, $\{[(1/Cb)/(1/Ca+1/Cb] \times Vdd\}$. Here, The input voltage Vo1 to VCO 4 and the output frequency $f_0$ satisfies such a relationship as $f_0 = fr + K \times Vo1$, where fr is a freerunning frequency and K is a conversion gain of VCO 4. In other words, the output frequency $f_0$ from VCO 4 varies around the freerunning frequency fr. At the same time, $f_0$ is proportional to Vo1. Further, the input voltage Vo1 which is required to obtain the desired frequency $f_0$ is specific to VCO 4. Such a specific value can be calculated. Therefore, if the desired frequency $f_0$ and the specific input voltage Vo1 are fixed beforehand and if the capacitance ratio of capacitors Ca 15 and Cb 16 is fixed beforehand under such a relationship as Ca:Cb=Vo1: (Vdd–Vo1), the value of Vo2 can be controlled to obtain the desired frequency $f_0$, when the set-up frequency has been inputted or changed, or when the dividing ratio has been changed. Therefore, the pull-in time can be reduced by repressing the initial deviations in frequency and phase of the input signal fi and feedback signal $f_0/N$ into minimum value.

Further, in equilibrium state, the voltage Vo1 is controlled by PD 1 and charge pump 2.

Further, even if the combined impedance of register Rb 13 and capacitor C 14 is made higher than the impedance of capacitor Ca 15 or capacitor Cb 16, the contribution of register Rb 13 and capacitor C 14 can be neglected, when the set-up frequency has been is inputted or changed, or when the dividing ratio has been changed. Further, the value of Vo2 can be adjusted to be the input voltage value which is required to obtain the desired frequency $f_0$.

Embodiment 2

Figure 2:
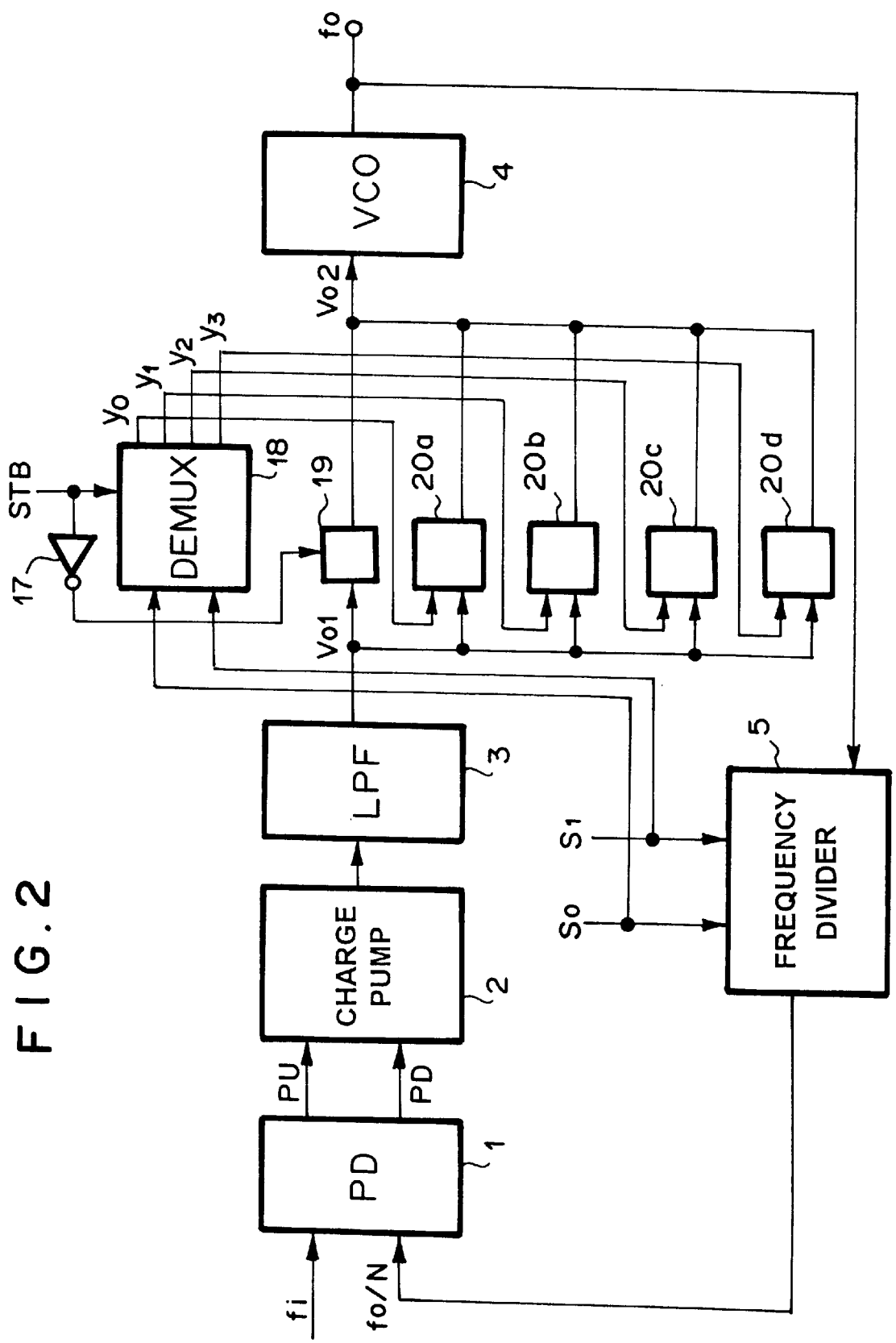
FIG. 2 is a circuit diagram of the PLL circuit of the second mode of the present invention.
Figure 4A:
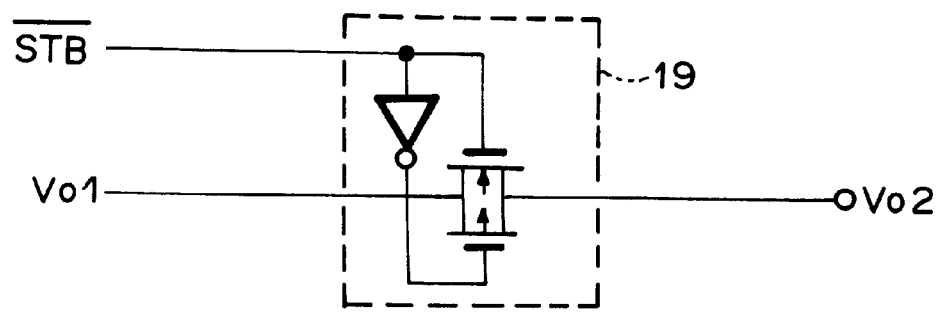
FIG. 4A is a circuit diagram of an analog switch.
Figure 4B:
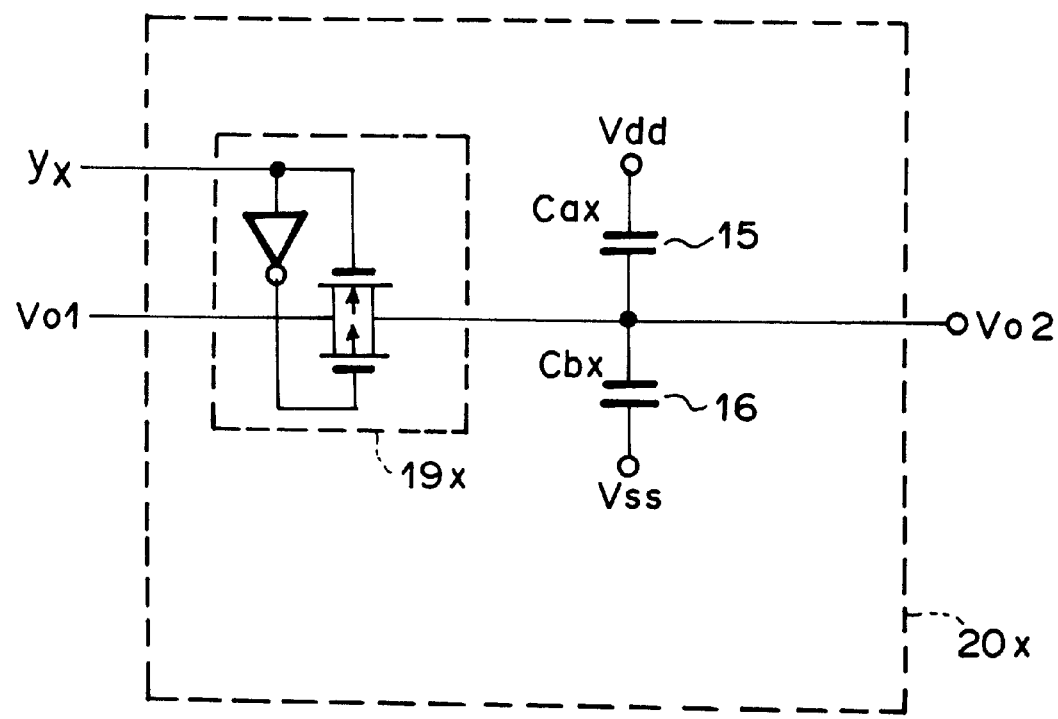
FIG. 4B is a circuit diagram of a capacitor portion.

A circuit diagram explaining the second embodiment of the present invention is shown in FIG. 2. As shown in FIG. 2, demultiplexer (DEMUX) 18 is connected with NOT circuit 17 which is further connected with analog switch 19. DEMUX 18 is connected also with capacitor portions 20a to 20d (hereinafter referred to as 20x) each of which comprises an analog switch and a capacitor. FIG. 3 is a circuit diagram of DEMUX 18. FIG. 4A is a circuit diagram of analog switch 19. FIG. 4B is a circuit diagram of capacitor portion 20x each of which comprises an analog switch and a capacitor. In the following, only the differences from the first embodiment of the present invention are explained.

Signals $S_0$ and $S_1$ are control signals which decide the dividing ratio of frequency divider 5 and are inputted into DEMUX 18 as well as frequency divider 5. Further, the signal STB becomes high level, when signal S1 and input signal fi are inputted into PLL circuit or changed in PLL circuit. Signals $S_0$, $S_1$ and STB are inputted into DEMUX 18. When the signal STB becomes low, all the outputs $y_x$ from DEMUX 18 become low. The electric potential of the signal STB is inverted by NOT circuit 17. Then, the inverted signal of the signal STB turns on analog switch 19 and changes the output voltage Vo1 from LPF 3 into the input voltage Vo2 into VCO 4, without passing through any capacitor portion 20x. In other words, the inverted signal of the signal STB functions as a bypass signal. On the other hand, when signal STB becomes high, an analog switch 19 is turned off and one of the output signals $y_0$ to $y_3$ becomes high on the basis of the values of control signals $S_0$ and $S_1$ by DEMUX 18. When high level signal $y_x$ is inputted into capacitor portion 20$x$, analog switch 19$x$ in capacitor portion 20$x$ is turned on and the output Vo1 from LPF 3 becomes Vo2 which is almost the same as the input voltage which is required to obtain the desired frequency $f_0$ by virtue of Cax and Cbx, as explained in the first mode of the present invention. For example, it is supposed here that the dividing ratio be 1/1,1/2,1/3, . . . and that the corresponding output frequency from VCO 4 be 1fi,2fi,3fi, . . . and that the input voltage required to obtain such output frequencies be $Vo2_1$, $Vo2_2$, $Vo2_3$, . . . . Further, the capacitance ratios are fixed under the conditions as follows: $Ca_1:Cb_1=Vo2_1:(Vdd-Vo2_1)$; $Ca_2: Cb_2=Vo2_2: (Vdd-Vo2_2)$; $Ca_3:Cb_3 =Vo2_3:(Vdd-Vo2_3)$. By selecting one of capacitor portions 20$x$ on the basis of the dividing ratio by using DEMUX 18, the output voltage Vo1 from LPF 4 can approach the input voltage which is required to obtain the desired frequency $f_0$. Thus, the deviation of the phase and frequency can be minimized.

As explained above, the pull-in time can be reduced, when the input signal frequency fi has been inputted or changed, and when the dividing ratio has been changed.

Depending upon the cases, the dividing ratio may happen to be unity.

Further, when analog switch 19 is connected with VCO 4, the response to the output from PD 1 is improved compared to the first mode of the present invention, because capacitance portions 20$x$ are separated. Accordingly, the response is maintained, even when the impedances of capacitance portions 20$x$ are fixed to be greater than that of LPF 3.

Although the present invention has been shown and described with respect to the best mode embodiment thereof, it should be understood by those skilled in the art that the foregoing and various other changes, omissions, and additions in the form and detail thereof may be made therein without departing from the spirit and scope of the present invention.

What is claimed is:

1. A PLL circuit wherein the pull-in time is reduced, comprises:

a voltage controlled oscillator including a control terminal;

a frequency divider which divides a frequency of an output signal from the voltage controlled oscillator;

a phase detector which compares a phase of a standard signal and a frequency-divided signal, and outputs an advanced phase signal and a delayed phase signal;

a low pass filter, including a capacitor, for eliminating a high frequency component and noise of said advanced phase signal and said delayed phase signal;

a charge pump which charges and discharges, depending upon said advanced phase signal and said delayed phase signal, said capacitor in said low pass filter;

a plurality of voltage suppliers which supply the control terminal of said voltage controlled oscillator with voltages which correspond to desired voltages decided by output frequencies from said voltage controlled oscillator, when an output from said low pass filter is not connected with said control terminal of said voltage controlled oscillator, wherein each of said voltage suppliers comprises a capacitor which is connected between said low pass filter and said control terminal of said voltage controlled oscillator; and a switch which selectively connects said control terminal of said voltage controlled oscillator with any one of said voltage suppliers.

2. A PLL circuit wherein the pull-in time is reduced, comprises:

a voltage controlled oscillator having a control terminal;

a frequency divider which divides a frequency of an output signal from the voltage controlled oscillator;

a phase detector which compares a phase of a standard signal and a frequency-divided signal, and outputs an advanced phase signal and a delayed phase signal;

a low pass filter, including a capacitor, for eliminating the high frequency component and noise of said advanced phase signal and said delayed phase signal;

a charge pump which charges and discharges said capacitor of said low pass filter, depending upon said advanced phase signal and said delayed signal; and a voltage supplier which supplies the control terminal of said voltage controlled oscillator with a voltage which corresponds to a desired voltage decided by output frequencies from said voltage controlled oscillator, when an output from said low pass filter is not connected with said control terminal of said voltage controlled oscillator, wherein said voltage supplier comprises a first capacitor which is connected between an external voltage source and said control terminal of said voltage controlled oscillator, and a second capacitor which is connected between said control terminal and ground.

3. A PLL circuit wherein the pull-in time is reduced, comprises:

a voltage controlled oscillator including a control terminal;

a frequency divider which divides a frequency of an output signal from the voltage controlled oscillator;

a phase detector which compares a phase of a standard signal and a frequency-divided signal, and outputs an advanced phase signal and a delayed phase signal;

a low pass filter, including a capacitor, for eliminating a high frequency component and noise of said advanced phase signal and said delayed phase signal;

a charge pump which charges and discharges, depending upon said advanced phase signal and said delayed phase signal, said capacitor in said low pass filter;

a plurality of voltage suppliers which supply the control terminal of said voltage controlled oscillator with voltages which correspond to desired voltages decided by output frequencies from said voltage controlled oscillator, when an output from said low pass filter is not connected with said control terminal of said voltage controlled oscillator; and a switch which selectively connects said control terminal of said voltage controlled oscillator with any one of said voltage suppliers, wherein each of said voltage suppliers comprises a first capacitor which is connected between an external voltage source and said control terminal of said voltage controlled oscillator, and a second capacitor which is connected between said control terminal and ground.

4. The PLL circuit according to claim 2, wherein Ca: $Cb=V_0:(Vdd-V_0)$, where Ca is the capacitance of said first capacitor, Cb is the capacitance of said second capacitor, Vdd is the voltage of said external voltage source, and $V_0$ is the desired voltage corresponding to said output frequency of said voltage controlled oscillator.

5. The PLL circuit according to claim 4, wherein Ca: $Cb=V_0:(Vdd-V_0)$, where Ca is the capacitance of said first capacitor, Cb is the capacitance of said second capacitor, Vdd is the voltage of said external voltage source, and $V_0$ is the desired voltage corresponding to said output frequency of said voltage controlled oscillator.

6. A PLL circuit wherein the pull-in time is reduced, comprises:

a voltage controlled oscillator including a control terminal;

a frequency divider which divides a frequency of an output signal from the voltage controlled oscillator;

a phase detector which compares a phase of a standard signal and a frequency-divided signal, and outputs an advanced phase signal and a delayed phase signal;

a low pass filter, including a capacitor, for eliminating a high frequency component and noise of said advanced phase signal and said delayed phase signal;

a charge pump which charges and discharges, depending upon said advanced phase signal and said delayed phase signal, said capacitor in said low pass filter;

a plurality of voltage suppliers which supply the control terminal of said voltage controlled oscillator with voltages which correspond to desired voltages decided by output frequencies from said voltage controlled oscillator, when an output from said low pass filter is not connected with said control terminal of said voltage controlled oscillator; and a switch which selectively connects said control terminal of said voltage controlled oscillator with any one of said voltage suppliers, an input for accepting a stand-by signal and a signal which prescribes a frequency dividing ratio in the frequency divider;

an output for outputting a selection signal which selects one of said voltage suppliers, when said stand-by signal is active;

a demultiplexer for outputting a by-pass signal, when said stand-by signal is active;

a connector for connecting said control terminal of said voltage controlled oscillator with one of said voltage suppliers, when said selection signal is active; and a short-circuit device for short-circuiting said low pass filter and said control terminal.

7. A PLL circuit wherein the pull-in time is reduced, comprises:

a voltage controlled oscillator having a control terminal;

a frequency divider which divides a frequency of an output signal from the voltage controlled oscillator;

a phase detector which compares a phase of a standard signal and a frequency-divided signal, and outputs an advanced phase signal and a delayed phase signal;

a low pass filter, including a capacitor, for eliminating a high frequency component and noise of said advanced phase signal and said delayed phase signal;

a charge pump which charges and discharges said capacitor of said low pass filter, depending upon said advanced phase signal and said delayed signal; and a voltage supplier which supplies the control terminal of said voltage controlled oscillator with a voltage which corresponds to a desired voltage decided by output frequencies from said voltage controlled oscillator, when an output from said low pass filter is not connected with said control terminal of said voltage controlled oscillator, wherein the impedance of said voltage supplier is smaller than that of said low pass filter.

8. The PLL circuit according to claim 2, wherein the impedance of said voltage supplier is smaller than that of said low pass filter.

9. The PLL circuit according to claim 4, wherein the impedance of said voltage supplier is smaller than that of said low pass filter.

10. A PLL circuit wherein the pull-in time is reduced, comprises:

a voltage controlled oscillator including a control terminal;

a frequency divider which divides a frequency of an output signal from the voltage controlled oscillator;

a phase detector which compares a phase of a standard signal and a frequency-divided signal, and outputs an advanced phase signal and a delayed phase signal;

a low pass filter, including a capacitor, for eliminating a high frequency component and noise of said advanced phase signal and said delayed phase signal;

a charge pump which charges and discharges, depending upon said advanced phase signal and said delayed phase signal, said capacitor in said low pass filter;

a plurality of voltage suppliers which supply the control terminal of said voltage controlled oscillator with voltages which correspond to desired voltages decided by output frequencies from said voltage controlled oscillator, when an output from said low pass filter is not connected with said control terminal of said voltage controlled oscillator; and a switch which selectively connects said control terminal of said voltage controlled oscillator with any one of said voltage suppliers, wherein each of said voltage suppliers comprises a first capacitor which is connected between an external voltage source and said control terminal of said voltage controlled oscillator, and a second capacitor which is connected between said control terminal and ground.

11. The PLL circuit according to claim 3, wherein the impedance of each of said voltage suppliers is smaller than that of said low pass filter.

12. The PLL circuit according to claim 5, wherein the impedance of each of said voltage suppliers is smaller than that of said low pass filter.

13. The PLL circuit as claimed in claim 1, wherein said plurality of voltage suppliers supply the control terminal of said voltage controlled oscillator with specific input voltages designated in advance with reference to a desired output frequency of said voltage controlled oscillator.

* * * * *